US006034876A

United States Patent [19]
Ohno et al.

[11] Patent Number: 6,034,876
[45] Date of Patent: Mar. 7, 2000

[54] ELECTRONIC DEVICE COMPRISING STRUCTURE FIXING ELECTRICAL CONNECTOR DIRECTLY TO DEVICE CASE THROUGH NO PRINTED CIRCUIT BOARD HAVING THE ELECTRICAL CONNECTOR

[75] Inventors: Akira Ohno, Tokyo; Hiroshi Kawagishi, Saitama; Kenichi Motoki, Saitama; Tsuneo Ohno, Saitama, all of Japan

[73] Assignees: Japan Aviation Electronics Industry, Limited; Honda Giken Kogyo Kabushiki Kaisha, both of Tokyo, Japan

[21] Appl. No.: 08/882,983

[22] Filed: Jun. 26, 1997

[30] Foreign Application Priority Data

Jun. 27, 1996 [JP] Japan .................... 8-167276

[51] Int. Cl.[7] .................. H05K 5/00; H01R 9/09
[52] U.S. Cl. .............. 361/752; 361/759; 361/736; 439/76.1
[58] Field of Search .................. 361/752, 759, 361/683, 736, 728; 439/76.1, 377

[56] References Cited

U.S. PATENT DOCUMENTS

| | | | |
|---|---|---|---|
| 4,858,070 | 8/1989 | Buron et al. | 361/695 |
| 5,091,826 | 2/1992 | Arnett et al. | 361/776 |
| 5,144,533 | 9/1992 | Annett | 361/740 |
| 5,159,534 | 10/1992 | Hudson et al. | 361/683 |

*Primary Examiner*—Leo P. Picard
*Assistant Examiner*—Jayprakash N. Gandhi
*Attorney, Agent, or Firm*—Laff, Whitesel & Saret, Ltd.; J. Warren Whitesel

[57] ABSTRACT

In an electronic device comprising a case, a printed circuit board disposed in the case, and an electrical connector mounted on the printed circuit board for connecting the printed circuit board with an external circuit, the printed circuit board is fixed directly to the electrical connector, and the electrical connector is fixed directly to the case, so that the printed circuit board is avoided from deformation when a mating connector is fitted into the electrical connector mounted on the printed circuit board.

7 Claims, 8 Drawing Sheets

ELECTRONIC DEVICE COMPRISING STRUCTURE FIXING ELECTRICAL CONNECTOR DIRECTLY TO DEVICE CASE THROUGH NO PRINTED CIRCUIT BOARD HAVING THE ELECTRICAL CONNECTOR

BACKGROUND OF THE INVENTION

This invention relates to an electronic device which has a case, a printed circuit board disposed in the case, and an electrical connector mounted on the printed circuit board for connecting the printed circuit board with an external circuit or apparatus, and particularly, to the device having a structure mounting the printed circuit board and the electrical connector within the case.

In the prior art device, the printed circuit board is directly fixed to the case. While, the electrical connector is fixed to the printed circuit board but is not directly fixed to the case.

In the prior art device, the printed circuit board is often unfortunately deformed by an external force caused when a receptacle (not shown) as a mating connector is fitted to the connector. This is because the connector is fixed directly to the printed circuit board and indirectly to the case.

Furthermore, a position of the connector in relation to the case is determined in dependence upon positional relations between the connector and the printed circuit board and between the printed circuit board and the case, so that the relative position of the connector arise in accordance with, for example, dimensional precision of the connector, the printed circuit board, and the case. This means that the prior art electronics device cannot insure a reliable and excellent water proof in application on a water-proof type device wherein a packing is used for sealing a clearance left between the case and the receptacle mated into the connector. The clearance varies in response to variation of the position of the connector in relation to the case. That is, the precision of the clearance is dependent on the assembling precision of four components, that is, the case, the receptacle, the connector, and the printed circuit board. The assembling precision increased requires to increase the dimensional precision of each of the components. This results in a high or expensive cost of the electronic device.

SUMMARY OF THE INVENTION

It is consequently an object of this invention to provide an electronic device capable having a structure wherein an electrical connector can be fixedly disposed with an improved positional precision relative to and within a case without relation to dimensional precision of a printed circuit board on which the electrical connector is mounted.

It is another object of this invention to provide an inexpensive electronic device of a water-proof type wherein it is possible to insure a reliable water proof by a packing element disposed a clearance formed between the case and a mating connector mated the electrical connector.

According to this invention, there is provided an electronic device, comprising a case, a printed circuit board disposed in the case, and an electrical connector mounted on the printed circuit board for connecting the printed circuit board with an external circuit, wherein the printed circuit board is fixed directly to the electrical connector, and the electrical connector is fixed directly to the case.

In an aspect of this invention, the electronic device is formed into a water-proof type, wherein the case comprises a case body having a case side with a peripheral edge to form an opening and a case cover for closing the opening on the peripheral edge, wherein the case comprises a seal ring making water-proof seal between the case cover and the case body, the peripheral edge being formed with a groove receiving the seal ring.

DESCRIPTION OF THE PREFERRED EMBODIMENTS

Prior to description of preferred embodiments, a prior art electronic device of the type will be described with reference to FIGS. 1 and 2 so as to facilitate the better understanding this invention.

Figure 1:
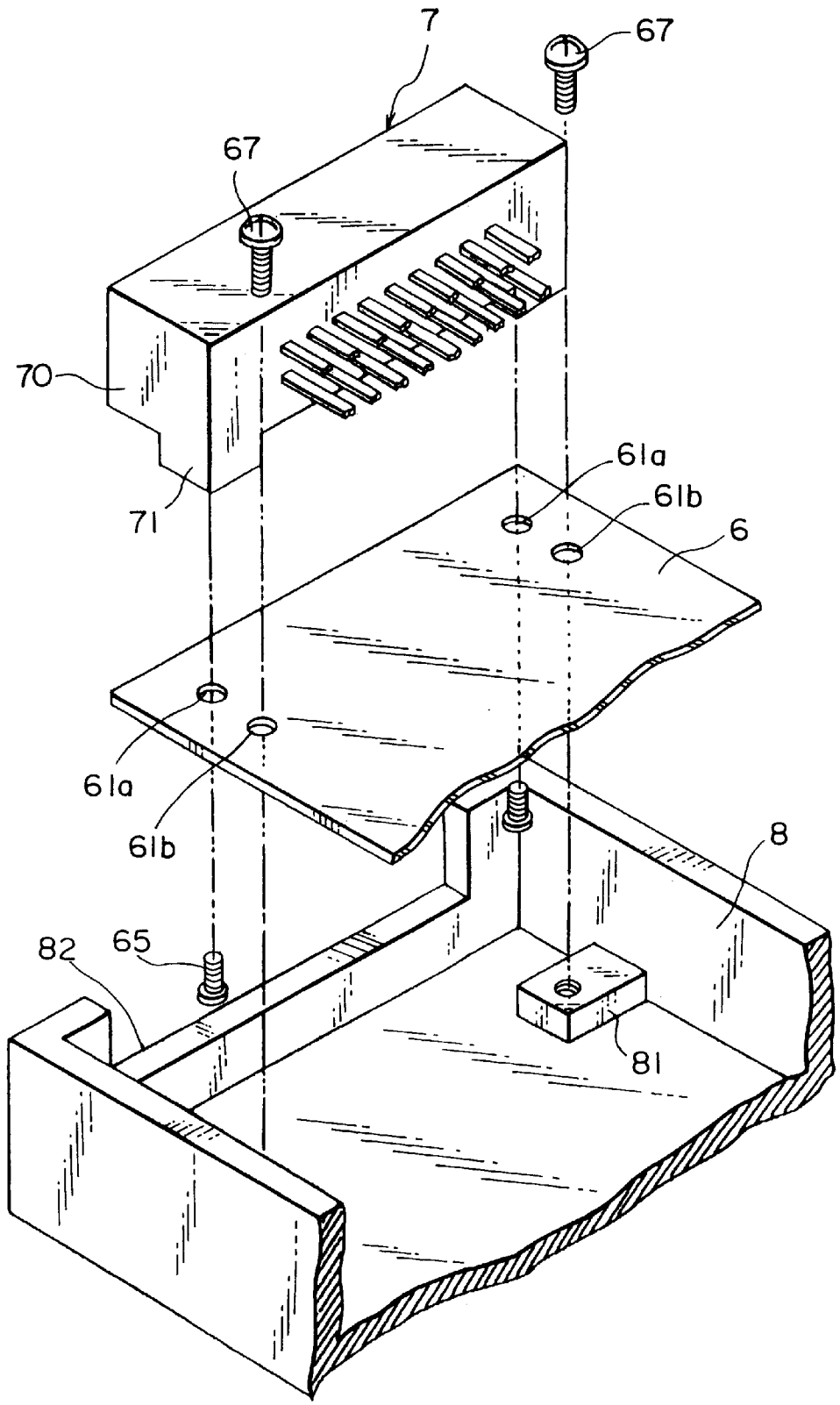
FIG. 1 is a partially exploded view of an example according to a prior art electronic device.
Figure 2:
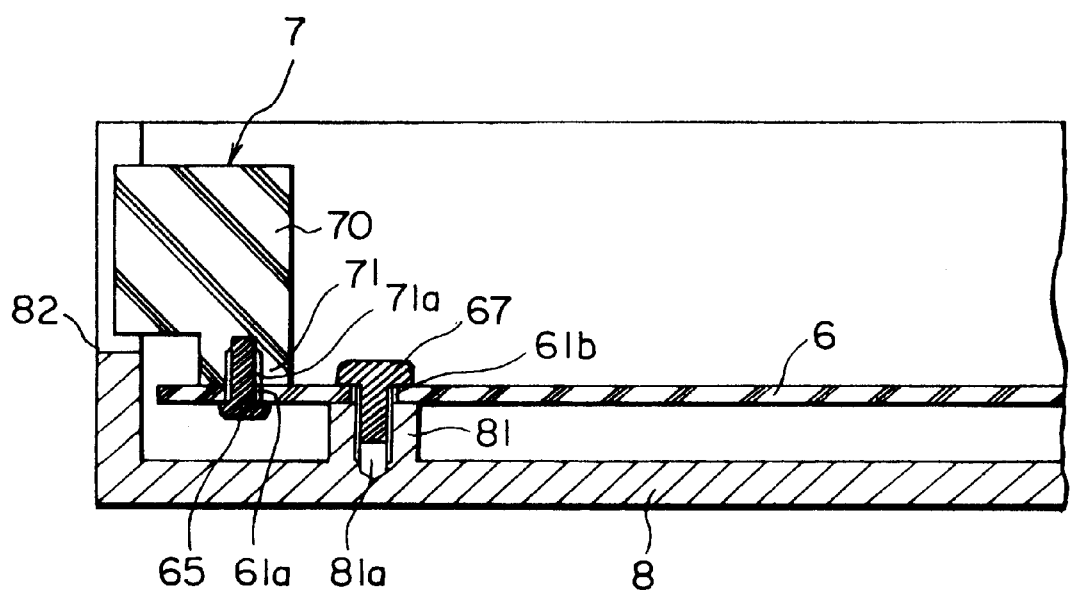
FIG. 2 is a partially cross-sectional view of the electronic device as assembled, taken along a plane including two central axes of left side screws 65 and 67 in FIG. 1.

As shown in FIGS. 1 and 2, a prior art electronic device, for example, an automobile electronic device, comprises an electrical connector 7 as a plug connector having a connector body 70 and a pair of mounting portions 71 extending downwardly, respectively, from both front right and left corners of a bottom of the connector body 70, a case 8 having a case body with projections 81 (one of which is shown in the figure) protruding inside thereof and a side portion with an opening 82 for receiving the connector 7, and a printed circuit board 6 with a plurality of screw-through holes 61a and 61b. The screw-through holes 61a and 61b are formed at the predetermined positions adjacent to an end of the printed circuit board 6.

The mounting portions 71 of the connector 7 are mounted on an upper surface of the end of the printed circuit board 6 so as to be in correspondence to the screw through holes 61a. A pair of screws 65 are upwardly driven through the screw-through holes 61a into a pair of screw holes 71a in which the mounting portions 71 are perforated to form bottomed openings, respectively, so that the connector 7 is fixedly mounted on the printed circuit board 6. On the other hand, a pair of screws 67 are driven into the screw-through holes 61a and the projections 81, respectively, so as to fix the printed circuit board 6 to the case 8 onto the projections 81.

Thus, the connector 7 is fixed indirectly to the case 8 through the printed circuit board 6.

The prior art electronic device has problems as described in the preamble.

Now referring to FIGS. 3 through 9, embodiments of this invention will be described In FIGS. 3 through 9, a plug connector 1 is shown which comprises a connector body 10 made of an insulator material. A plurality of contact pins 17 are held in the connector body 10 and are arranged in two rows. The connector body 10 is provided with a pair of mounting portions 11 downwardly extending (as in the figure) from opposite end portions of a bottom of the connector body 10 and a pair of connector projections 13a and 13b rearwardly (or forwardly in the figure) protruding from opposite end portions of a rear wall surface of the connector body 10. Those connector projections 13a and 13b are fixed to a case 3 as will be described hereinafter. The left one 13a of connector projections is shown to have a wall portion 14 integrally formed therewith which is engaged with a chuck used in a process for mounting and assembling the connector 1 onto a printed circuit board 5.

Each of the mounting portions 11 has a bottom surface in which a threaded hole 11a is formed upwardly from the bottom surface. A screw 41 is threaded into the threaded hole 11a to hold and fix the printed circuit board 5 to the connector body 10.

The printed circuit board 5 is fixedly disposed together with the connector 1 within the case 3.

The case 3 has a case top opening defined by a peripheral edge and is accompanied with a case cover 4 for closing the top opening. The peripheral edge is formed with a groove 3-1 in which a seal ring 4-1 is received for bringing into water-proof and sealing between the case cover 4 and the peripheral edge of the case 3.

The case 3 comprises an inside case surface and a pair of bosses 31 protruding from a bottom surface of the inside case surface. Each of the bosses 31 has a threaded bore 31a into which a screw 43 is threaded so as to fix the connector 1 to the case 3. The case 3 has a front side wall in which an interface window 32 through which a receptacle 9 as a mating connector is inserted to mate the connector 1.

Referring to FIGS. 5A, 5B, 7A and 7B, the connector projections 13a and 13b have screw-through holes 13-1 and 13-2 formed therein, respectively, in a direction of an arrow Z shown in the figures. Each of the screw-through holes 13-1 and 13-2 receives the screw 43 inserted thereinto then into the threaded bore 31a of the boss 43, so as to fix the connector 1 to the case 3.

The screw 43 has a screw head and a screw thread diameter defining a helical ridge. One of the screw-through holes 13-1 has a hole diameter larger than the screw thread diameter of the screw 43 but smaller than the screw head of the screw 43 so that the screw 43 can be freely moved through the screw-through hole 13-1.

Figure 5A:
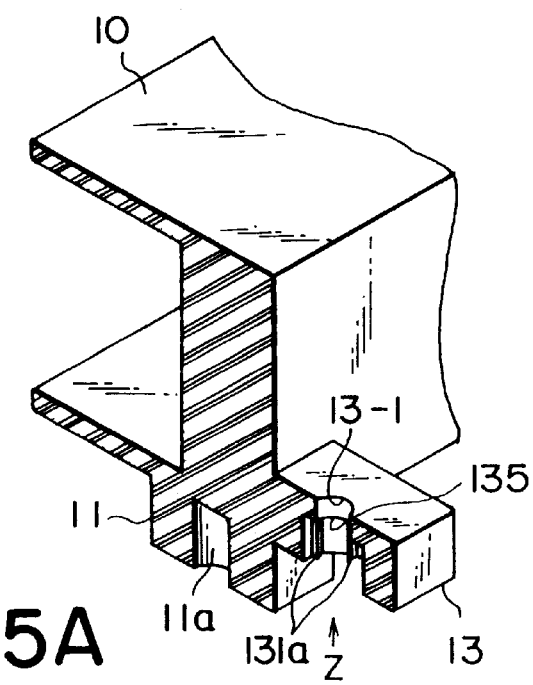
FIG. 5A is a partially perspective view of the connector body with a section taken along a plane A in FIG. 4.
Figure 5B:
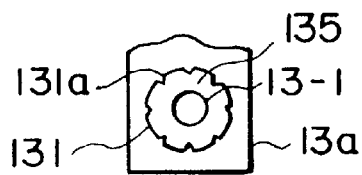
FIG. 5B is a view of a connector projection as seen in a direction of an arrow Z in FIG. 5A.

Referring to FIG. 5B, the connector projection 13a is formed with a coaxial recess 131 in a lower surface thereof which recess connects with the screw-through hole 13-1. The coaxial recess 131 is for receiving an upper portion or annular surface of the corresponding boss 31 and thus has a recess diameter slightly larger than the outside diameter of the boss 31. The coaxial recess 131 has an inner cylindrical surface on which a plurality of (eight) small projections 131a are formed to radially inwardly extend at equiangularly spaced (45 degree; constant) positions. The small projections 131a come into frictional contacts with the boss 31 fitted thereinto to position the boss 31 so that the boss 31 is in a transition fitting into the coaxial recess 131 with the small projections 131a. Thus, the coaxial recess 131 of the connector projection 13a serves as a reference for fixing the position of the connector 1 in relation to the case 3.

Figure 7A:
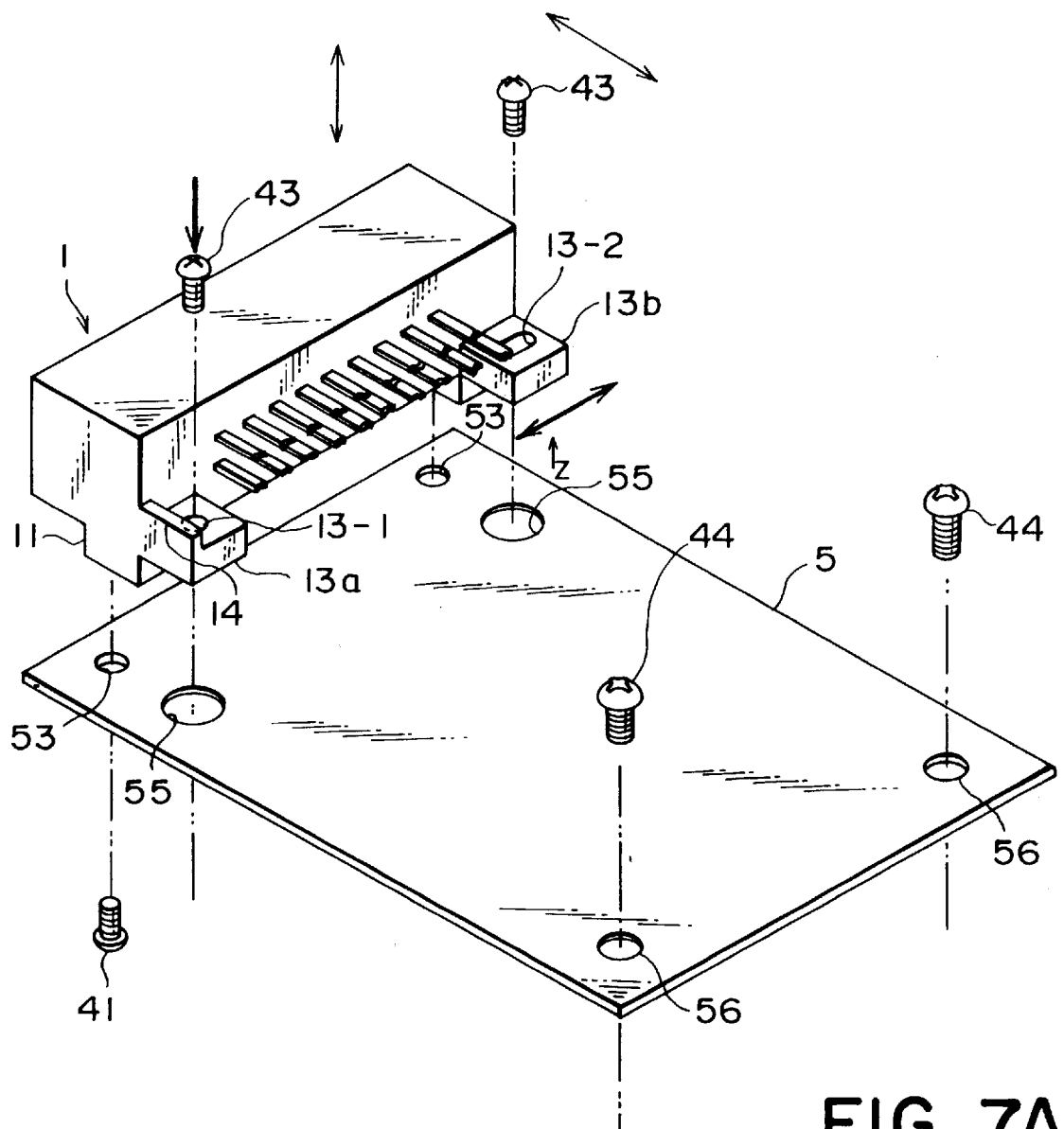
FIG. 7A is a partially enlarged view of a main portion of FIG. 3.
Figure 7B:
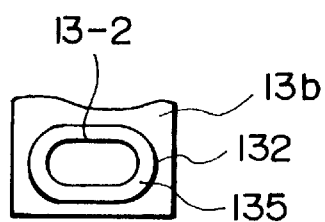
FIG. 7B is a view of a portion of a connector projection 13b as seen in a direction of an arrow Z in FIG. 7A.
Figure 8:
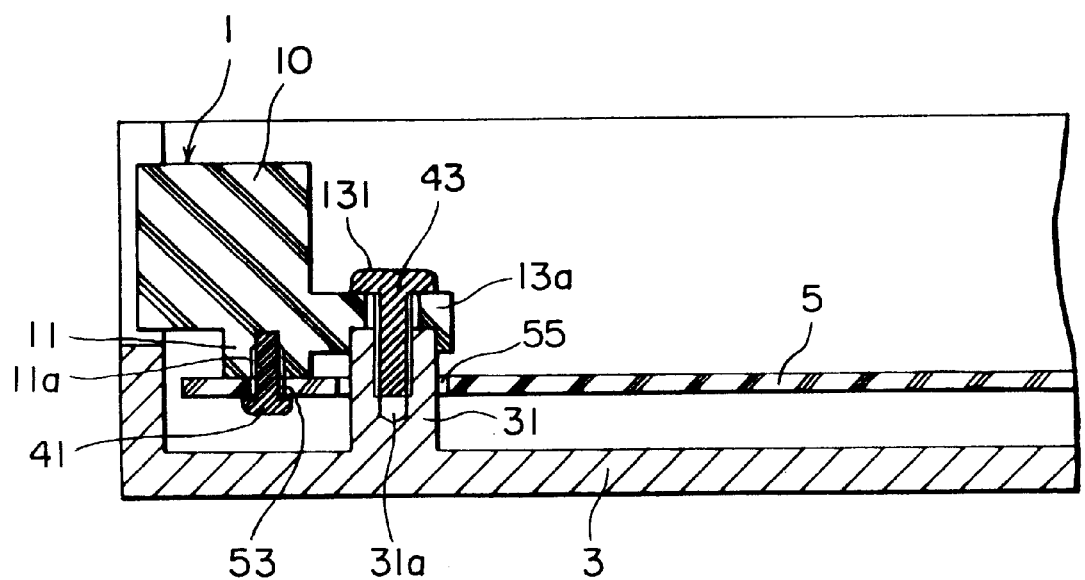
FIG. 8 is a cross-sectional view of the electronic device of FIG. 3 as assembled, taken along in a plane including axes of two left screws 41 and 43 depicted in FIG. 7.

Referring additionally to FIG. 7B, another or right one 13b of the connector projections is formed with the other 13-2 of the screw-through holes which is elongated in a lengthwise direction of the connector 1 so as to permit the connector 1 to be moved in a right and left direction freely but within a distance limited by the elongated hole 13-2. Incidentally, the elongated screw-through hole 13-2 has a width matching with the screw diameter of the screw 43 but allows the screw 43 to be smoothly inserted therethrough.

Further, the connector projection 13b is formed with an elongated recess 132 in a bottom surface thereof to connect with the elongated screw-through hole 13-2. Into the elongated recess, the corresponding one of bosses 31 is fitted and is freely moved in the lengthwise direction of the connector 1. The elongated recess 132 has a width matching with the outside diameter of the boss 31 but allows the boss 31 to be smoothly inserted thereinto. The elongated recess 132 of connector body 10 serves to determine the relative position of the connector 1 to the case 3 in the frontward and rearward direction and also to insure the positional freedom of the connector 1 relative to the case 3 so as to absorbing, in the right and left direction, a dimensional error of the connector body 10 and the case 3, when the connector body 10 is fixed to the case 3. Furthermore, the connector 1 is positioned relative to the case 3 in the up and down direction by the fact that the upper end of each of the bosses 31 abuts the bottom surface 135 of each of the recesses 131 and 132 of the connector projections 13a and 13b.

Figure 6A:
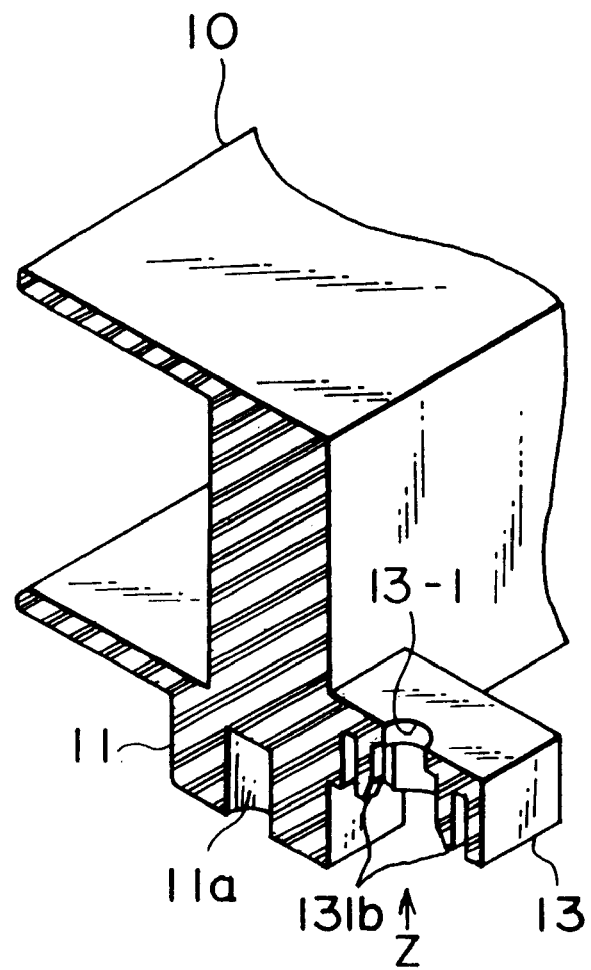
FIG. 6A is a partially perspective view of a connector according to a modification, like FIG. 5A.
Figure 6B:
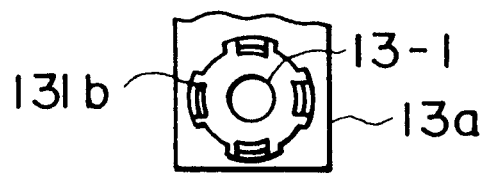
FIG. 6B is a view of a connector projection as seen in a direction of an arrow Z in FIG. 6A.

Referring to FIGS. 6A and 6B, four elastic fingers 131b are shown to be formed in the coaxial recess 131 which can be used in place of the small projections 131a shown in FIGS. 5A and 5B. The four elastic fingers 131b are equlangularly spaced (90 angular degree) on a bore of the coaxial recess 131 and extend in an axial direction of the screw-through hole 13-1.

Referring to FIGS. 7A and 7B, the printed circuit board 5 is formed with a pair of through holes 53 in an area thereof on which the connector 1 is mounted and positions corresponding to the threaded holes 11a (FIGS. 5A and 6A). Each of the through holes 53 has a diameter larger than that of each of the screws 41 to form a clearance from each of the screws 41. Furthermore, the printed circuit board 5 is formed with board-through holes 55 corresponding to the bosses 31 and allowing the bosses 31 to be loosely fitted therethrough, respectively. Each of the board-through holes 55 has a hole diameter larger than that of each of the bosses 31 to thereby form a clearance annular space between the printed circuit board 5 and the bosses 31. As a result, the printed circuit board 5 has increased freedom of movement in relative to the bosses 31 in the right and left direction and the back and forth direction.

Figure 3:
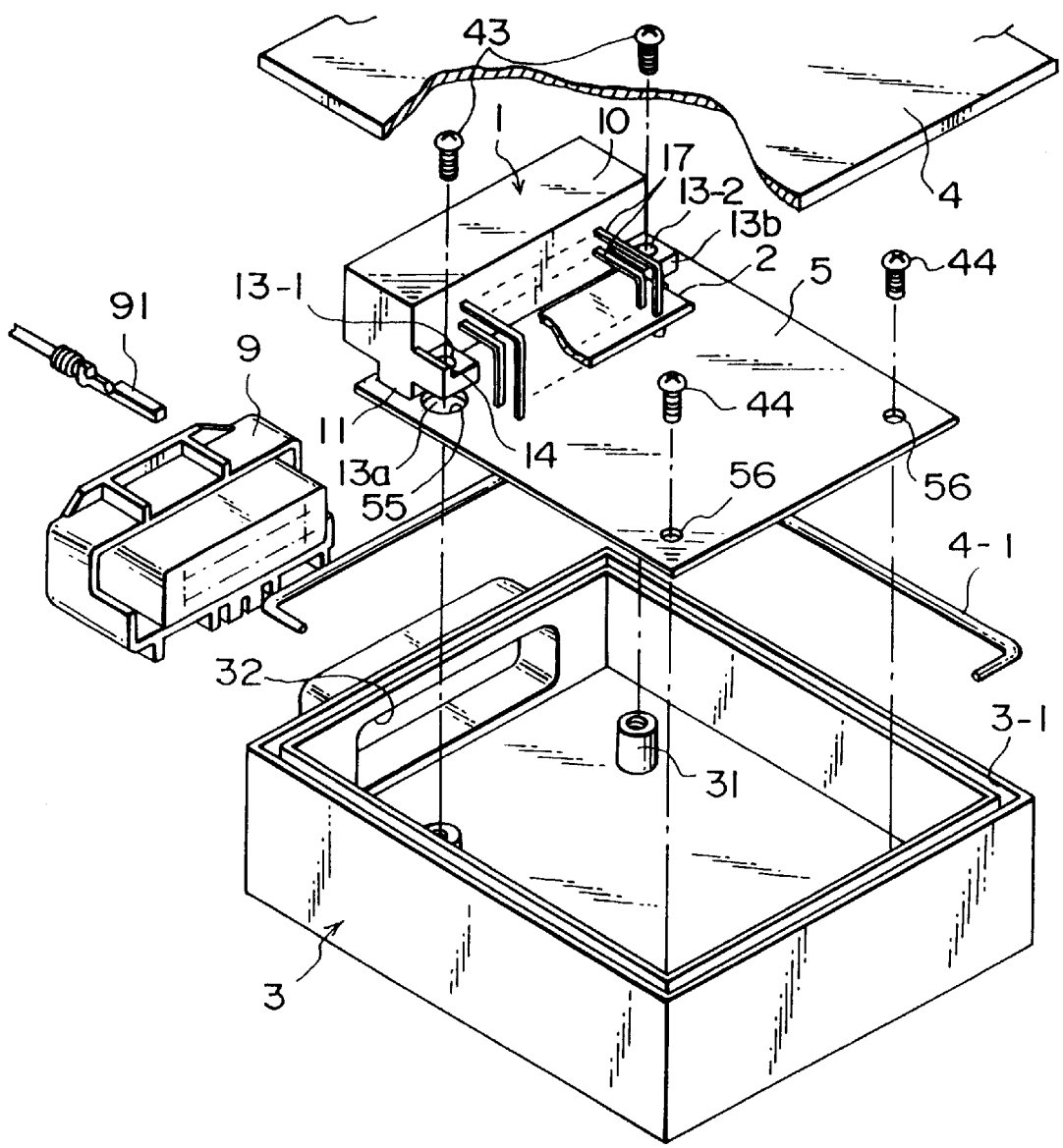
FIG. 3 is a partially exploded view of an electronic device according to an embodiment of this invention.
Figure 4:
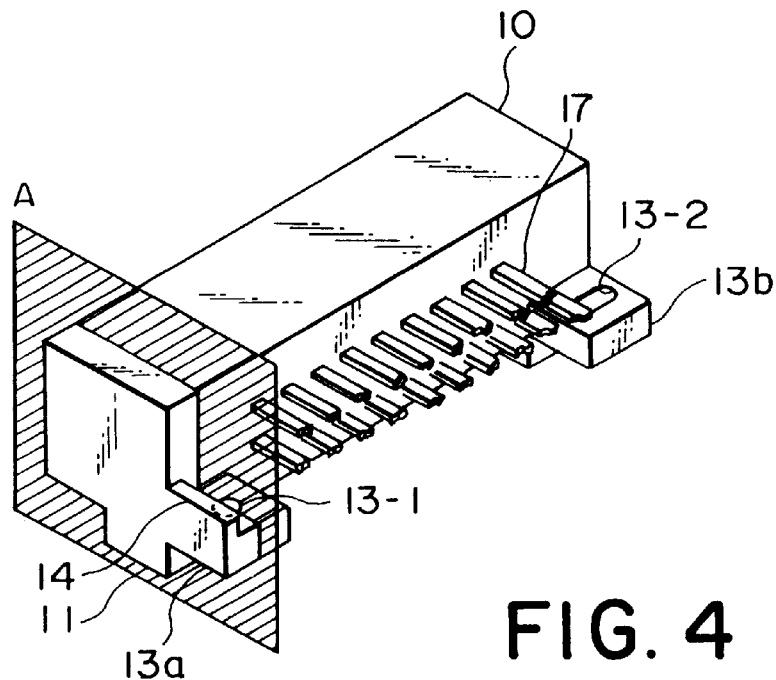
FIG. 4 is a perspective view of a connector body depicted in FIG. 3.

Referring to FIGS. 3 and 7, the printed circuit board 5 are further formed with a pair of screw-through holes 56 at positions spaced from the through holes 53. A pair of screws 44 are passed through the pair of screw-through holes 56 and are screwed into a bottom wall of the case 3 so as to fix the printed circuit board 5 to the case 3. Each of the screw-through holes 56 has a diameter larger than that of each of the screws 44 to form a clearance from each of the screws 44.

Clearances between through hole 53 and screw 41, between board-through hole 55 and boss 31 and between screw-through hole 56 and screw 44 prevent the deformation of the printed circuit board 5 by the thermal expansion difference between three components of the connector 1, the case 3, and the printed circuit board 5.

Now, description will be made as regards the assembling operation of the electronic device comprising the case 3, the connector 1 and the printed circuit board 5.

Figure 9:
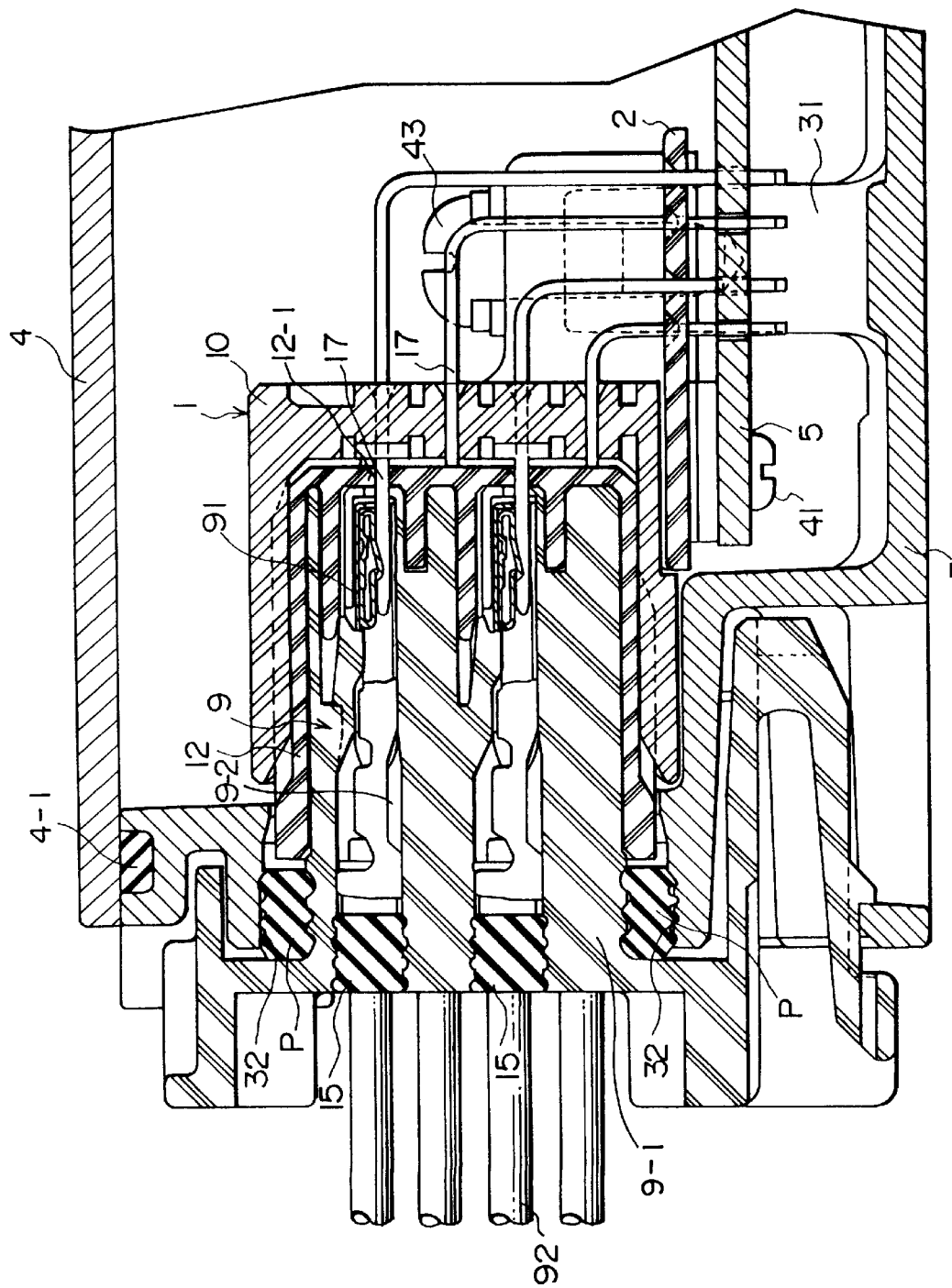
FIG. 9 is a cross-sectional view of a main part of the electronic device of FIG. 3 as assembled together with a mating connector fitted.

At first, the connector 1 is mounted on the printed circuit board 5. A plurality of pin contacts 17, which have an L-shaped configuration as shown in FIGS. 3 and 9, are connected to conductive patterns on the printed circuit board 5 by means of soldering.

Next, the screws 41 are driven into the threaded holes 11a of the mounting portions 11 of the connector 1 through the screw-through holes 53 of the printed circuit board 5, so that the connector 1 and the printed circuit board 5 are fixed to each other.

Subsequently, the connector 1 and the printed circuit board 5 are put into the case 3 with the bosses 31 passing through the board-through holes 55 of the printed circuit board 5, and the connector projections 13a and 13b are put onto the bosses 31 with the ends of the bosses fitted into the recesses 131 and 132. Then, the screws 43 are driven through the through holes 13-1 and 13-2 into the threaded bores 31a in the bosses 31, respectively, to fix the connector 1 to the case 3. Then, the screws 44 are also driven through the screw-through holes 56, respectively, to the bottom wall of the case 3.

Since the screw-through holes 13-1 and 13-2 in the connector projections 13a and 13b have the hole diameters slightly larger than screw diameters of the screws 43, it is possible to finely adjust the position of the connector 1 relative to the screws 43 in the right and left direction prior to the driving of the screws 43 so that the connector 1 is correctly positioned relative to the interface window 32. If necessary, washers or the like (not shown) may be used to finely adjust the level of the printed circuit 5 relative to the case 3 in the upward and downward direction.

After driving the screws 43, the connector projections 13a are pinched by the heads of the screws 43 and the bosses 31, respectively, so that the connector 1 is fixed to the case 3. Since the connector 1 is directly fixed to the case 3, they can assembled to each other with a reduced positional error relative to each other. Further, since the screw-through hole 13-2 of the connector projection 13b is an elongated hole, the thermal expansion of the connector body 10 and the case 3 can be absorbed Since there are formed clearances between through hole 53 and screw 41, between board-through hole 55 and boss 31 and between screw-through hole 56 and screw 44, differences in thermal expansion between connector 1, case 3, and printed circuit board 5 can be absorbed thereby.

Finally, the seal ring 4-1 is fitted into the groove 3-1 in the peripheral edge of the case 3, then, the top opening of the case 3 being closed by the cover 4 to seal off the interior of the case 3.

Referring to FIG. 9, the receptacle 9 is shown to be fitted through the interface window 9 of the case 3 to the plug connector 1. A packing P is attached to an outer surface of the receptacle 9 and comes into elastic contact with an inner edge of the interface window 32 to prevent water or something from entering any one of the receptacle 9, the connector 1, and the case 3.

The receptacle 9 is shown to have a plurality of socket contacts 91 for connecting and grasping the pin contacts 17 of the connector 1 of a plug type, respectively. The receptacle 9 comprises an insulator housing 9-1 supporting a plurality of socket contacts 91, a cover insulator 12 fixedly fitted onto and from the front side of the housing 9-1. The cover insulator 12 has guide holes 12-1 tapered for reliably guiding pin contacts 17 into the receptacle 9.

The receptacle 9 further has a plurality of water-proof plugs 15 of rubber closely fitted into a plurality of socket receiving holes 9-2. In detail, each of the socket contact 91 and an insulator jacket of a cable 92 electrically connected thereto are mechanically jointed by clamping the socket contact around the jacket. Each of the water-proof plug 15 covers the joint portion of the socket contact 91 with the jacket of the cable 92. Thus, the joint portion of the socket contact 91 with the jacket of the cable 92 is inserted into the socket receiving hole 9-2 together with the water-proof plugs 15 so that the socket receiving hole 9-2 is sealed from water.

By the way, FIG. 9 depicts the structure for assembling the connector 1 into the case 3 together with the printed circuit board 5 similar to that in FIG. 3. Therefore, the same reference numerals are shown and description is omitted thereto. Further, each of the L-shaped pin contacts 17 is shown as a whole to illustrate the connecting condition to the printed circuit board 5 in order to indicate electrical connection of the printed circuit board 5 with the connector 1.

In addition, a locator 2 is shown to be used for appropriately arranging end portions of the pin contacts 17 so as to insure a reliable insertion of the pin contacts 17 into through holes of the printed circuit board 5.

In the example of FIG. 9, inasmuch as the water-proof between the receptacle 9 and the interface window 32 of the case 3 is dependent on the clearance precision therebetween, it is necessary that the connector 1 to be connected to the receptacle 9 is correctly positioned relative to the interface window 32 of the case 3. In accordance with the present invention, the connector 1 is directly connected to the case 3, so that the position of the connector 1 it determined in relation to the case 3 without relation to the dimensional variation of the printed circuit board 5. Therefore, the connector 1 can be mounted to the case 3 with a high positional precision, so that the clearance between the receptacle 9 and the interface window 32 of the case 3 is also insured Thus, the water-proof of the device is improved.

What is claimed is:

1. An electronic device comprising a case, a printed circuit board disposed in said case, and an electrical connector mounted on said printed circuit board for connecting said printed circuit board with an external circuit, wherein said electrical connector is fixed directly to said case, and said printed circuit board is fixed directly to said electrical connector and stationarily disposed together with said electrical connector within said case through said electrical connector.

2. An electronic device as claimed in claim 1, said electrical connector having a connector body, wherein said printed circuit board has a board-through hole, said electrical connector has a connector projection extending from said connector body, and said connector projection is fixed to said case through said board-through hole.

3. An electronic device as claimed in claim 2, said case having an inside case surface, wherein said connector projection has a screw-through hole in correspondence to said board-through hole, said case has an inwardly directed boss protruding from said inside case surface and loosely passing through said board-through hole to said connector projection, said boss has a threaded bore in correspondence with said screw-through hole, and a screw is threaded into said threaded bore through said screw-through hole so that said electrical connector is fixedly mounted on said boss within said case.

4. An electronic device as claimed in claim 3, said case comprising a case body having a case side with a peripheral edge to form an opening and a case cover for closing said opening on said peripheral edge, wherein said case comprises a seal ring making water-proof seal between said case cover and said case body, said peripheral edge being formed with a groove receiving said seal ring.

5. An electronic device as claimed in claim 1, wherein said case is provided with a window for receiving a mating connector, said mating connector being fitted into said electrical connector through said window.

6. An electronic device comprising a case having an open window, a printed circuit board disposed within said case, and an electrical connector mounted on said printed circuit board for use in a connection through said open window to an external mating connector, wherein said electrical connector is exposed outside of said case through said open window for receiving said mating connector and is fixed directly to said case, and said printed circuit board has an end portion fixed directly to said electrical connector so that said end portion of said printed circuit board is stationarily disposed through said electrical connector, and said printed circuit board further has the opposite end portion supported to said case.

7. An electronic device as claimed in claim 6, wherein said mating connector is provided with a packing mounted onto an outer surface thereof, said packing comes into press-contact with an opening edge of said window to seal the clearance between said window and said mating connector when said mating connector is inserted into said window.

* * * * *

UNITED STATES PATENT AND TRADEMARK OFFICE
CERTIFICATE OF CORRECTION

PATENT NO. : 6,034,876
DATED : March 7, 2000
INVENTOR(S) : Akira Ohno; Hiroshi Kawagishi; Kenichi Motoki; Tsuneo Ohno It is certified that error appears in the above-identified patent and that said Letters Patent is hereby corrected as shown below:

Column 3, Line 50, delete "43" and insert --31--

Column 4, Line 24, insert --the-- after "of"

Column 5, Line 17, delete "53" and insert --56--

Column 5, Line 41, insert --and 13b-- after "13a"

Column 5, Line 49, insert --.-- after "absorbed"

Column 6, Line 9, delete "contact" and insert --contacts--

Column 6, Line 12, delete "plug" and insert --plugs--

Signed and Sealed this

Twenty-seventh Day of February, 2001

Attest:

NICHOLAS P. GODICI

Attesting Officer

Acting Director of the United States Patent and Trademark Office